United States Patent
Nakahara et al.

(10) Patent No.: US 8,647,810 B2
(45) Date of Patent: Feb. 11, 2014

(54) RESIST LOWER LAYER FILM-FORMING COMPOSITION, POLYMER, RESIST LOWER LAYER FILM, PATTERN-FORMING METHOD, AND METHOD OF PRODUCING SEMICONDUCTOR DEVICE

(75) Inventors: Kazuo Nakahara, Tokyo (JP); Tomoki Nagai, Tokyo (JP)

(73) Assignee: JSR Corporation, Tokyo (JP)

( * ) Notice: Subject to any disclaimer, the term of this patent is extended or adjusted under 35 U.S.C. 154(b) by 88 days.

(21) Appl. No.: 13/248,198

(22) Filed: Sep. 29, 2011

(65) Prior Publication Data

US 2012/0077124 A1    Mar. 29, 2012

(30) Foreign Application Priority Data

Sep. 29, 2010 (JP) ................................. 2010-219920
Sep. 15, 2011 (JP) ................................. 2011-202471

(51) Int. Cl.
*G03F 7/00* (2006.01)
*G03F 7/11* (2006.01)
*G03F 7/40* (2006.01)
*C08F 24/00* (2006.01)
*C08F 34/02* (2006.01)

(52) U.S. Cl.
USPC ........ 430/270.1; 430/927; 430/331; 430/317; 430/313; 526/268

(58) Field of Classification Search
USPC ............................ 430/270.1, 913, 927, 273.1
See application file for complete search history.

(56) References Cited

U.S. PATENT DOCUMENTS

| 4,882,391 | A | * | 11/1989 | Brindopke et al. ......... 525/327.2 |
| 5,686,547 | A | * | 11/1997 | Nye ................................. 528/15 |
| 5,693,691 | A | | 12/1997 | Flaim et al. |
| 5,919,599 | A | | 7/1999 | Meador et al. |
| 7,687,228 | B2 | * | 3/2010 | Hatakeyama et al. ........ 430/323 |
| 8,003,295 | B2 | * | 8/2011 | Hatakeyama .............. 430/270.1 |
| 8,057,982 | B2 | * | 11/2011 | Hatakeyama et al. ..... 430/270.1 |
| 8,207,351 | B2 | * | 6/2012 | Fujiwara et al. ............. 548/228 |
| 8,288,072 | B2 | * | 10/2012 | Hatakeyama et al. ..... 430/270.1 |
| 2003/0087181 | A1 | * | 5/2003 | Nishi et al. ................. 430/270.1 |
| 2003/0100687 | A1 | * | 5/2003 | Ohrbom et al. .............. 525/498 |
| 2003/0134986 | A1 | * | 7/2003 | Ohrbom et al. .............. 525/242 |
| 2004/0214945 | A1 | * | 10/2004 | Uozumi ........................ 524/551 |
| 2007/0092656 | A1 | * | 4/2007 | Keul et al. ..................... 427/400 |
| 2008/0167489 | A1 | * | 7/2008 | Stone et al. ................... 560/158 |
| 2008/0286486 | A1 | * | 11/2008 | Herlihy et al. ................ 427/521 |
| 2010/0068650 | A1 | * | 3/2010 | Nishimura et al. ........ 430/280.1 |
| 2010/0230136 | A1 | * | 9/2010 | Ichikawa et al. ............. 174/250 |
| 2010/0233629 | A1 | * | 9/2010 | Wada ......................... 430/286.1 |
| 2011/0114569 | A1 | * | 5/2011 | Kim et al. ..................... 210/739 |
| 2011/0236826 | A1 | * | 9/2011 | Hatakeyama et al. ..... 430/270.1 |
| 2012/0009527 | A1 | * | 1/2012 | Hatakeyama et al. ....... 430/325 |
| 2012/0009529 | A1 | * | 1/2012 | Hatakeyama ................ 430/325 |
| 2012/0070783 | A1 | * | 3/2012 | Sakakibara et al. ....... 430/285.1 |
| 2012/0094234 | A1 | * | 4/2012 | Matsuda et al. ........... 430/285.1 |
| 2012/0202150 | A1 | * | 8/2012 | Sakakibara et al. ....... 430/270.1 |
| 2012/0308938 | A1 | * | 12/2012 | Furukawa et al. ........... 430/325 |
| 2012/0316286 | A1 | * | 12/2012 | Mecfel-Marczewski et al. ............................. 524/547 |

FOREIGN PATENT DOCUMENTS

| JP | 05078600 | A | * | 3/1993 |
| JP | 2003012725 | A | * | 1/2003 |
| JP | 2007031357 | A | * | 2/2007 |
| JP | 2009223294 | A | * | 10/2009 |
| JP | 2011191573 | A | * | 9/2011 |

OTHER PUBLICATIONS

Machine translation of JP2007-031357 (no date).*
Taylor et al., "Methacrylate Resists and Antireflective Coatings for 193 nm Lithography", SPIE, 1999, pp. 174-185, vol. 3678.
Meador et al., "Recent Progress in 193 nm Antireflective Coatings", SPIE, 1999, pp. 800-809, vol. 3678.

* cited by examiner

*Primary Examiner* — Amanda C. Walke
(74) *Attorney, Agent, or Firm* — Ditthavong Mori & Steiner, P.C.

(57) ABSTRACT

A resist lower layer film-forming composition includes (A) a polymer that includes a cyclic carbonate structure. The polymer (A) includes a structural unit (I) shown by the following formula (1).

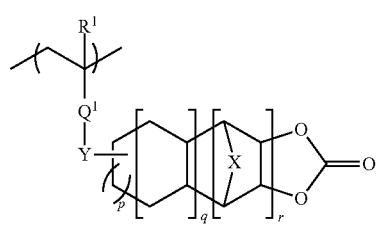

(1)

12 Claims, No Drawings

RESIST LOWER LAYER FILM-FORMING COMPOSITION, POLYMER, RESIST LOWER LAYER FILM, PATTERN-FORMING METHOD, AND METHOD OF PRODUCING SEMICONDUCTOR DEVICE

BACKGROUND OF THE INVENTION

1. Field of the Invention

The invention relates to a resist lower layer film (bottom coating)-forming composition, a polymer, a resist lower layer film, a pattern-forming method, and a method of producing a semiconductor device.

2. Discussion of the Background

A semiconductor device production process has utilized a lithographic microfabrication process using a photoresist composition. The microfabrication process includes a step of forming a resist film on a substrate, a step of exposing the resist film by applying radiation (e.g., ultraviolet rays) to the resist film, a step of developing the exposed resist film, and a step of etching the substrate using the resulting resist pattern as a protective film. In recent years, radiation (e.g., ArF excimer laser light (193 nm) or EUV (13.5 nm)) having a wavelength shorter than that of KrF excimer laser light (248 nm) has been used for a semiconductor device production process along with an increase in the degree of integration of semiconductor devices. When using short-wavelength radiation, however, it may be difficult to form an excellent fine pattern due to diffused reflection from the substrate, standing waves, and the like. In order to deal with this problem, a method that forms a resist lower layer film (e.g., bottom anti-reflective coating (BARC)) between the resist film and the substrate has been extensively studied.

An inorganic resist lower layer film formed of titanium, titanium dioxide, titanium nitride, chromium oxide, carbon, α-silicon, or the like, and an organic resist lower layer film formed of a light-absorbing substance and a polymer compound have been known as the resist lower layer film. A vacuum deposition system, a CVD system, a sputtering system, or the like is required to form the inorganic resist lower layer film, while a special system is not required to form the organic resist lower layer film. Therefore, the organic resist lower layer film has been extensively studied. For example, U.S. Pat. No. 5,919,599 discloses an acrylic resin resist lower layer film that includes a hydroxyl group (crosslinkable group) and a light-absorbing group in one molecule, and U.S. Pat. No. 5,693,691 discloses a novolac resin resist lower layer film that includes a hydroxyl group (crosslinkable group) and a light-absorbing group in one molecule.

It is desired that an organic resist lower layer film-forming composition have a high light/radiation absorbance, does not undergo intermixing with a resist film, can prevent a situation in which a low-molecular-weight component is diffused from the resist lower layer film-forming composition to the resist film during application or heating (drying), and have a high dry etching rate as compared with the resist (see Proc. SPIE, Vol. 3678, 174-185 (1999) and Proc. SPIE, Vol. 3678, 800-809 (1999), for example). A resist lower layer film-forming composition is also desired to exhibit higher resolution, form a rectangular resist pattern having a smaller pattern size, ensure that the resist lower layer film exhibits good adhesion to the resist film, and exhibit high pattern collapse resistance along with an increase in the degree of integration of semiconductor devices.

In particular, development of a resist lower layer film-forming composition that can implement a high etching selectivity ratio with respect to the resist film and the substrate when forming a pattern by dry etching, and can form a resist lower layer film that exhibits high pattern collapse resistance, and a resist lower layer film that has the above properties has been strongly desired for the current semiconductor device production process in order to deal with a decrease in pattern size.

SUMMARY OF THE INVENTION

The invention was conceived in view of the above situation. An object of the invention is to provide a resist lower layer film-forming composition that forms a resist lower layer film that exhibits a high etching selectivity ratio when forming a pattern by dry etching, implements a high etching selectivity ratio with respect to the resist film, and exhibits high pattern collapse resistance, a resist lower layer film, and a pattern-forming method and a method of producing a semiconductor device using the same.

According to one aspect of the invention, a resist lower layer film-forming composition includes (A) a polymer that includes a cyclic carbonate structure. Since the resist lower layer film-forming composition includes a cyclic carbonate structure, the etching rate of the resulting resist lower layer film is improved. The resist lower layer film also exhibits high pattern collapse resistance due to excellent adhesion to a resist film.

The polymer (A) preferably includes a structural unit (I) shown by the following formula (1).

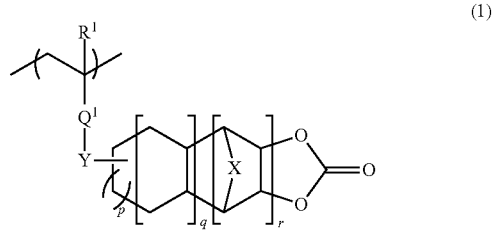

(1)

wherein $R^1$ represents a hydrogen atom, a halogen atom, a methyl group, or a trifluoromethyl group, $Q^1$ represents a divalent linking group, Y represents a single bond, a methylene group, a linear or branched alkylene group having 2 to 10 carbon atoms, an arylene group having 6 to 20 carbon atoms, a 6 to 20-membered heteroarylene group, or a combination thereof, provided that some or all of the hydrogen atoms of the alkylene group, the arylene group, or the heteroarylene group may be substituted with a substituent, and the alkylene group may include an oxygen atom in its carbon chain, p is an integer from 0 to 3, q is 0 or 1, r is an integer from 0 to 2, and X represents —$CH_2$—, —$CH_2$—$CH_2$—, —O—, —S—, or —$SO_2$—, provided that a plurality of X may be either the same or different when r is 2.

When the polymer (A) includes the structural unit (I) shown by the formula (1), a resist lower layer film formed using the resist lower layer film-forming composition exhibits an improved etching rate and excellent adhesion to a resist film.

The polymer (A) preferably further includes a structural unit (II) shown by the following formula (2).

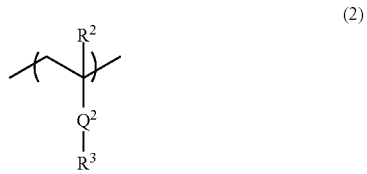

(2)

wherein $R^2$ represents a hydrogen atom, a halogen atom, a methyl group, or a trifluoromethyl group, $Q^2$ represents a divalent linking group, and $R^3$ represents a hydrogen atom, a linear or branched alkyl group having 1 to 15 carbon atoms, an aryl group having 6 to 20 carbon atoms, an aralkyl group having 7 to 20 carbon atoms, or a 6 to 20-membered heteroaryl group, provided that some or all of the hydrogen atoms of the alkyl group, the aryl group, the aralkyl group, or the heteroaryl group may be substituted with a substituent.

When the polymer (A) further includes the structural unit (II) shown by the formula (2), the polymer (A) exhibits excellent reactivity with a crosslinking agent or a crosslinkable group, so that a lower layer film that does not undergo intermixing with a resist film can be formed.

It is preferable that the polymer (A) include a structural unit shown by the following formula (1-1) as the structural unit (I), and include at least one structural unit selected from the group consisting of a structural unit (II-1) shown by the following formula (2-1) and a structural unit (II-2) shown by the following formula (2-2) as the structural unit (II).

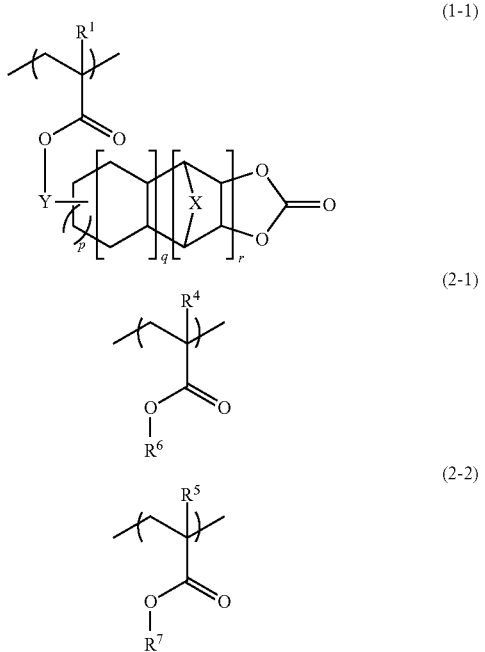

wherein $R^1$, X, Y, p, q, and r are the same as defined for the formula (1), $R^4$ represents a hydrogen atom, a halogen atom, a methyl group, or a trifluoromethyl group, $R^6$ represents an alkyl group having 1 to 15 carbon atoms or an aryl group having 6 to 20 carbon atoms, provided that some or all of the hydrogen atoms of the alkyl group or the aryl group are substituted with a substituent, at least one substituent being a group that includes a hydroxyl group or an amino group, $R^5$ represents a hydrogen atom, a halogen atom, a methyl group, or a trifluoromethyl group, and $R^7$ represents a phenyl group, a naphthyl group, an anthryl group, or a linear or branched alkyl group having 1 to 15 carbon atoms, provided that some or all of the hydrogen atoms of the phenyl group, the naphthyl group, or the anthryl group may be substituted with a substituent other than a hydroxyl group and an amino group, and some or all of the hydrogen atoms of the alkyl group are substituted with a substituent, at least one substituent being a phenyl group, a naphthyl group, or an anthryl group, provided that some or all of the hydrogen atoms of the phenyl group, the naphthyl group, or the anthryl group may be substituted with a substituent other than a hydroxyl group and an amino group.

When the polymer (A) includes the structural unit (II-1) that includes a hydroxyl group or an amino group, a crosslinking reaction with a crosslinking agent is promoted, so that the resulting resist lower layer film exhibits improved hardness and adhesion to a resist film. When the polymer (A) includes the structural unit (II-2) that includes an aromatic ring, a resist lower layer film that exhibits excellent radiation (e.g., ArF excimer laser light) absorbency can be formed.

It is preferable that the polymer (A) include the structural units (II-1) and (II-2) or the structural unit (II-1) as the structural unit (II), and $R^6$ represent the aryl group. When the polymer (A) includes the structural units (II-1) and (II-2) or the structural unit (II-1) wherein $R^6$ represents an aryl group, a crosslinking reaction with a crosslinking agent is promoted, so that the resulting resist lower layer film exhibits improved hardness, improved adhesion to a resist film, and excellent radiation (e.g., ArF excimer laser light) absorbency.

It is preferable that the resist lower layer film-forming composition further include (B) a crosslinking agent. Since the resist lower layer film-forming composition includes a structural unit that includes a hydroxyl group or an amino group, a crosslinking reaction occurs between the crosslinking agent (B) and the polymer, so that intermixing of the resulting resist lower layer film with a resist film is suppressed.

The crosslinking agent (B) preferably includes at least two crosslinkable functional groups. When the crosslinking agent (B) includes at least two crosslinkable functional groups, self-condensation of the crosslinking agent and a crosslinking reaction with the polymer (A) are further promoted, so that the hardness of a resist lower layer film formed using the composition is further improved.

It is preferable that the polymer (A) further include a structural unit (III) that includes a fluorine atom. When the resist lower layer film-forming composition includes a polymer that includes a fluorine atom, the etching rate of the resulting resist lower layer film is further improved.

According to another aspect of the invention, a polymer includes a structural unit (I) shown by the following formula (1-1), a structural unit (II-1) shown by the following formula (2-1), and a structural unit (II-2) shown by the following formula (2-2).

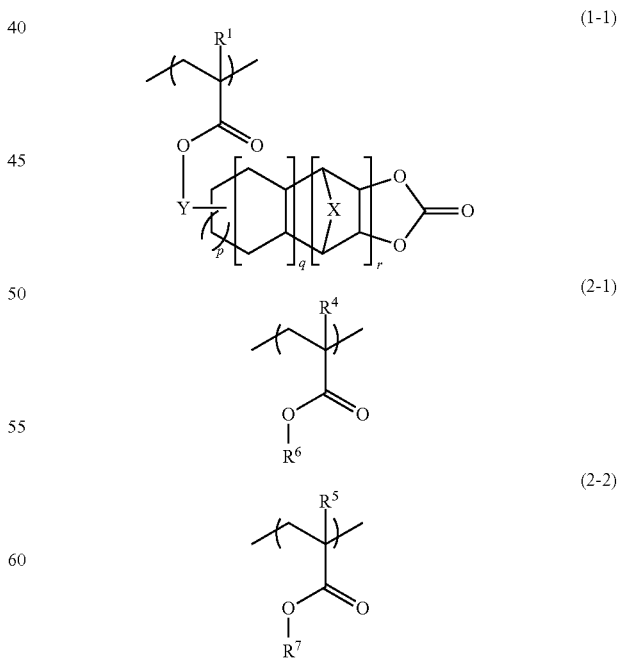

wherein $R^1$, X, Y, p, q, and r are the same as defined for the formula (1), $R^4$ represents a hydrogen atom, a halogen atom, a methyl group, or a trifluoromethyl group, $R^6$ represents an alkyl group having 1 to 15 carbon atoms or an aryl group having 6 to 20 carbon atoms, provided that some or all of the hydrogen atoms of the alkyl group or the aryl group are substituted with a substituent, at least one substituent being a group that includes a hydroxyl group or an amino group, $R^5$ represents a hydrogen atom, a halogen atom, a methyl group, or a trifluoromethyl group, and $R^7$ represents a phenyl group, a naphthyl group, an anthryl group, or a linear or branched alkyl group having 1 to 15 carbon atoms, provided that some or all of the hydrogen atoms of the phenyl group, the naphthyl group, or the anthryl group may be substituted with a substituent other than a hydroxyl group and an amino group, and some or all of the hydrogen atoms of the alkyl group are substituted with a substituent, at least one substituent being a phenyl group, a naphthyl group, or an anthryl group, provided that some or all of the hydrogen atoms of the phenyl group, the naphthyl group, or the anthryl group may be substituted with a substituent other than a hydroxyl group and an amino group.

The polymer may suitably be used as a material for the resist lower layer film-forming composition according to one aspect of the invention. Specifically, the polymer includes a structural unit that includes a hydroxyl group or an amino group, and a structural unit that includes an aromatic ring. Therefore, when using the polymer as a material for the resist lower layer film-forming composition according to one aspect of the invention, the resulting resist lower layer film exhibits excellent hardness, excellent adhesion, and excellent radiation (e.g., ArF excimer laser light) absorbency.

According to another aspect of the invention, a resist lower layer film is formed using the resist lower layer film-forming composition according to one aspect of the invention. Since the resist lower layer film is formed using the resist lower layer film-forming composition, the resist lower layer film exhibits a high etching rate in a dry-etching step. The resist lower layer film also exhibits high pattern collapse resistance due to excellent adhesion to a resist film.

According to another aspect of the invention, a pattern-forming method includes:
(1) applying the resist lower layer film-forming composition to a substrate to form a resist lower layer film;
(2) applying a resist composition to the resist lower layer film to form a resist film;
(3) exposing the resist film by selectively applying radiation to the resist film via a photomask;
(4) developing the exposed resist film to form a resist pattern; and
(5) dry-etching the resist lower layer film and the substrate using the resist pattern as a mask to form a pattern.

The pattern-forming method according to one aspect of the invention makes it possible to form a finer pattern since the resist lower layer film formed using the resist lower layer film-forming composition has the above properties.

In the pattern-forming method according to one aspect of the invention, the resist film is preferably exposed by applying light having a wavelength of 193 nm to the resist film. Since the resist lower layer film formed using the resist lower layer film-forming composition can prevent diffused reflection of ArF excimer laser light having a wavelength of 193 nm from the substrate, it is possible to form a fine pattern while achieving higher resolution.

According to another aspect of the invention, a method of producing a semiconductor device includes:
(1) applying the resist lower layer film-forming composition to a substrate to form a resist lower layer film;
(2) applying a resist composition to the resist lower layer film to form a resist film;
(3) exposing the resist film by selectively applying radiation to the resist film via a photomask;
(4) developing the exposed resist film to form a resist pattern;
(5) dry-etching the resist lower layer film and the substrate using the resist pattern as a mask to form a pattern; and
(6) forming an integrated circuit element that includes the pattern.

The method of producing a semiconductor device according to one aspect of the invention makes it possible to produce a semiconductor device that includes a finer pattern since the resist lower layer film formed using the resist lower layer film-forming composition has the above properties.

In the method of producing a semiconductor device according to one aspect of the invention, the resist film is preferably exposed by applying light having a wavelength of 193 nm to the resist film. Since the resist lower layer film formed using the resist lower layer film-forming composition can prevent diffused reflection of ArF excimer laser light having a wavelength of 193 nm from the substrate, it is possible to produce a semiconductor device that includes a fine pattern while achieving higher resolution.

A resist lower layer film that exhibits a high etching rate and implements a high etching selectivity ratio with respect to a resist film can be formed by utilizing the resist lower layer film-forming composition according to one aspect of the invention. The resist lower layer film can suppress pattern collapse due to excellent adhesion to a resist film. Therefore, a finer pattern can be formed by utilizing the resist lower layer film-forming composition.

DESCRIPTION OF THE EMBODIMENTS

A resist lower layer film-forming composition, a resist lower layer film, a pattern-forming method using the resist lower layer film-forming composition, and a method of producing a semiconductor device according to embodiments of the invention are described in detail below.
<Resist Lower Layer Film-Forming Composition>

A resist lower layer film-forming composition according to one embodiment of the invention includes (A) a polymer. The resist lower layer film-forming composition may preferably include (B) a crosslinking agent. The resist lower layer film-forming composition may further include an additional optional component as long as the effects of the invention are not impaired. Each component is described in detail below.
<Polymer (A)>

The polymer (A) includes a cyclic carbonate structure. Since the polymer (A) includes a cyclic carbonate structure that has a high oxygen atom content, a resist lower layer film formed using the resist lower layer film-forming composition that includes the polymer (A) exhibits a high etching rate, so that the etching selectivity ratio of the resist lower layer film to the resist film increases. The resist lower layer film also exhibits excellent adhesion to the resist film. Examples of the cyclic carbonate structure include a group shown by the following formula (3), and the like.

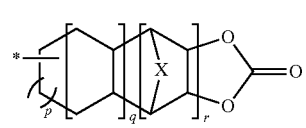

(3)

wherein p is an integer from 0 to 3, q is 0 or 1, r is an integer from 0 to 2, X represents —$CH_2$—, —$CH_2$—$CH_2$—, —O—, —S—, or —SO$_2$—, provided that a plurality of X may be either the same or different when r is 2, and "*" indicates a bonding hand, provided that some or all of the hydrogen atoms of the cyclic carbonate group may be substituted with a substituent.

Preferable examples of the group shown by the formula (3) include the groups shown by the following formulas (3-1) and (3-2).

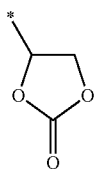

(3-1)

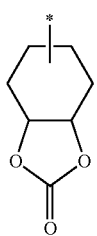

(3-2)

wherein "*" indicates a bonding hand.

The polymer (A) preferably includes a structural unit (I) shown by the formula (1) that includes a cyclic carbonate structure, and preferably further includes a structural unit (II) shown by the formula (2) and a structural unit (III) that includes a fluorine atom. The polymer (A) may further include an additional structural unit as long as the effects of the invention are not impaired. Each structural unit is described in detail below. Note that the polymer (A) may include only one type of each structural unit, or may include two or more types of each structural unit.

Structural Unit (I)

The polymer (A) preferably includes the structural unit (I) shown by the formula (1).

$R^1$ in the formula (1) represents a hydrogen atom, a halogen atom, a methyl group, or a trifluoromethyl group, $Q^1$ represents a divalent linking group, Y represents a single bond, a methylene group, a linear or branched alkylene group having 2 to 10 carbon atoms, an arylene group having 6 to 20 carbon atoms, a 6 to 20-membered heteroarylene group, or a combination thereof, provided that some or all of the hydrogen atoms of the alkylene group, the arylene group, or the heteroarylene group may be substituted with a substituent, and the alkylene group may include an oxygen atom in its carbon chain, p is an integer from 0 to 3, q is 0 or 1, r is an integer from 0 to 2, and X represents —CH$_2$—, —CH$_2$—CH$_2$—, —O—, —S—, or —SO$_2$—, provided that a plurality of X may be either the same or different when r is 2.

Examples of the divalent linking group represented by $Q^1$ include —O—, —S—, —COO—, —COO—, —NHCOO—, —NHCONH—, —SO$_2$—, —CO—, and the like. Among these, —COO— is preferable.

Examples of the linear or branched alkylene group having 2 to 10 carbon atoms represented by Y include an ethylene group, a propylene group, a butylene group, a pentylene group, a hexylene group, a heptylene group, an octylene group, a nonylene group, a decylene group, and the like. Among these, a methylene group, an ethylene group, a propylene group, a butylene group, and a pentylene group are preferable.

Examples of the arylene group having 6 to 20 carbon atoms represented by Y include a phenylene group, a methylphenylene group, a methoxyphenylene group, a nitrophenylene group, a 1,4-naphthylene group, a 2,6-naphthylene group, and the like.

Examples of the heteroarylene group represented by Y include a pyridinediyl group, a quinolinediyl group, a quinoxalinediyl group, and the like.

Examples of the structural unit (I) shown by the formula (1) include structural units shown by the following formulas, and the like.

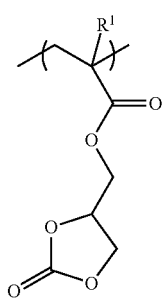

(I-1)

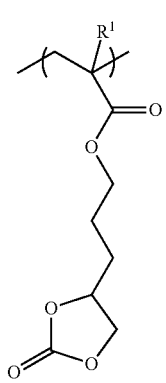

(I-2)

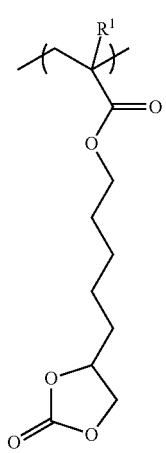

(I-3)

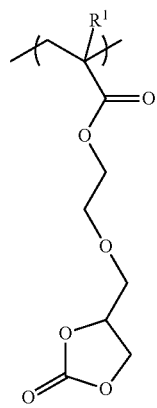
(I-4)
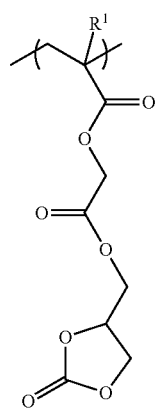
(I-5)
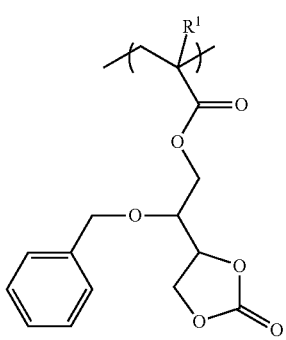
(I-6)
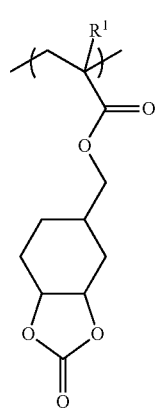
(I-7)
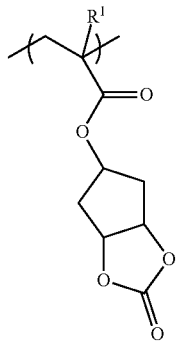
(I-8)
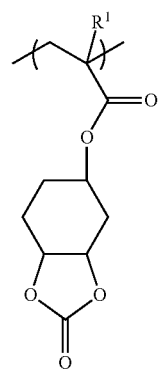
(I-9)
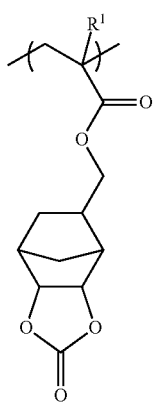
(I-10)
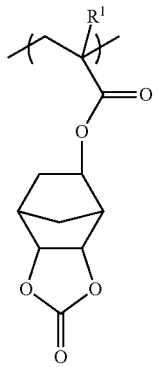
(I-11)
wherein $R^1$ is the same as defined for the formula (1).
Among these, the structural unit (I) shown by the formula (I-1) is preferable.
Examples of a monomer that produces the structural unit (I) include 4-(1,3-dioxa-2-oxo)cyclopentyl(meth)acrylate and the like.

The content of the structural unit (I) in the polymer (A) is preferably 5 to 60 mol %, and more preferably 10 to 50 mol %. If the content of the structural unit (I) is within the above range, a resist lower layer film formed using the resist lower layer film-forming composition exhibits a high etching rate, so that the etching selectivity ratio of the resist lower layer film to the resist film increases.

Structural Unit (II)

The polymer (A) preferably further includes the structural unit (II) shown by the formula (2). If the polymer (A) further includes the structural unit (II) in addition to the structural unit (I), the polymer (A) exhibits improved reactivity with a crosslinking agent or a crosslinkable group. Moreover, a resist lower layer film formed using the resist lower layer film-forming composition rarely undergoes intermixing with the resist film.

$R^2$ in the formula (2) represents a hydrogen atom, a halogen atom, a methyl group, or a trifluoromethyl group, $Q^2$ represents a divalent linking group, and $R^3$ represents a linear or branched alkyl group having 1 to 15 carbon atoms, an aryl group having 6 to 20 carbon atoms, an aralkyl group having 7 to 20 carbon atoms, or a 6 to 20-membered heteroaryl group, provided that some or all of the hydrogen atoms of the alkyl group, the aryl group, the aralkyl group, or the heteroaryl group may be substituted with a substituent.

Examples of the divalent linking group represented by $Q^2$ include the groups mentioned above in connection with the divalent linking group represented by $Q^1$ in the formula (1), and the like. Among these, —COO— is preferable.

Examples of the linear or branched alkyl group having 1 to 15 carbon atoms represented by $R^3$ include a methyl group, an ethyl group, a propyl group, an n-butyl group, an i-butyl group, an n-pentyl group, an i-pentyl group, an n-hexyl group, an i-hexyl group, and the like.

Examples of the aryl group having 6 to 20 carbon atoms represented by $R^3$ include a phenyl group, a naphthyl group, and the like. Among these, a phenyl group is preferable.

Examples of the aralkyl group having 7 to 20 carbon atoms represented by $R^3$ include a benzyl group, a phenyleneethyl group, a naphthylenemethyl group, and the like.

Examples of the 6 to 20-membered heteroaryl group represented by $R^3$ include a pyridyl group, a quinolinedyl group, a pyrazyl group, and the like.

A substituent with which some or all of the hydrogen atoms of the alkyl group, the aralkyl group, the aryl group, or the heteroaryl group may be substituted is preferably a hydroxyl group or an amino group, and more preferably a hydroxyl group.

The polymer (A) preferably includes at least one structural unit selected from the group consisting of a structural unit (II-1) shown by the formula (2-1) and a structural unit (II-2) shown by the formula (2-2) as the structural unit (II). Since the structural unit (II-1) includes at least one hydroxyl group or amino group as the substituent, the reactivity of the polymer (A) with a crosslinking agent or a crosslinkable group is improved. Since the structural unit (II-2) includes a phenyl group, a naphthyl group, or an anthryl group, a resist lower layer film formed using the resist lower layer film-forming composition exhibits excellent radiation absorbency when using a KrF excimer laser, an ArF excimer laser, a DUV fluorine laser, or the like.

$R^4$ in the formula (2-1) represents a hydrogen atom, a halogen atom, a methyl group, or a trifluoromethyl group, and $R^6$ represents an alkyl group having 1 to 15 carbon atoms or an aryl group having 6 to 20 carbon atoms, provided that some or all of the hydrogen atoms of the alkyl group or the aryl group are substituted with a substituent, at least one substituent being a group that includes a hydroxyl group or an amino group. Examples of the substituent other than a group that includes a hydroxyl group or an amino group include a halogen atom, an alkyl group having 1 to 10 carbon atoms, a cycloalkyl group having 3 to 10 carbon atoms, and the like.

Examples of the alkyl group having 1 to 15 carbon atoms include the groups mentioned above in connection with the linear or branched alkyl group having 1 to 15 carbon atoms represented by $R^3$.

Examples of the aryl group having 6 to 20 carbon atoms include the groups mentioned above in connection with the aryl group having 6 to 20 carbon atoms represented by $R^3$.

$R^5$ in the formula (2-2) represents a hydrogen atom, a halogen atom, a methyl group, or a trifluoromethyl group, and $R^7$ represents a phenyl group, a naphthyl group, an anthryl group, or a linear or branched alkyl group having 1 to 15 carbon atoms, provided that some or all of the hydrogen atoms of the phenyl group, the naphthyl group, or the anthryl group may be substituted with a substituent other than a hydroxyl group and an amino group, and some or all of the hydrogen atoms of the alkyl group are substituted with a substituent, at least one substituent being a phenyl group, a naphthyl group, or an anthryl group, provided that some or all of the hydrogen atoms of the phenyl group, the naphthyl group, or the anthryl group may be substituted with a substituent other than a hydroxyl group and an amino group. Examples of the substituent other than a hydroxyl group and an amino group include a halogen atom, an alkyl group having 1 to 10 carbon atoms, a cycloalkyl group having 3 to 10 carbon atoms, and the like.

Examples of the linear or branched alkyl group having 1 to 15 carbon atoms represented by $R^7$ include the groups mentioned above in connection with the linear or branched alkyl group having 1 to 15 carbon atoms represented by $R^3$.

It is more preferable that the polymer (A) include the structural units (II-1) and (II-2) or the structural unit (II-1) as the structural unit (II), and $R^6$ represent the aryl group.

The structural unit (II-1) is preferably a structural unit shown by the following formula (2-1-1), (2-1-2), or (2-1-4).

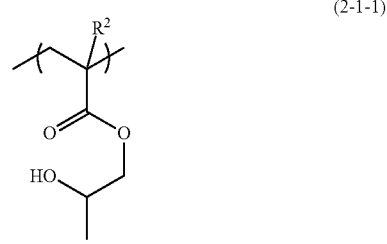

(2-1-1)

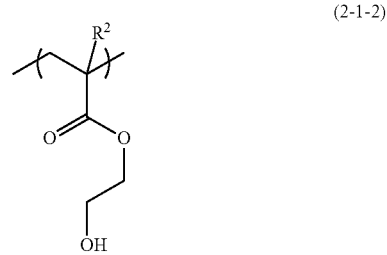

(2-1-2)

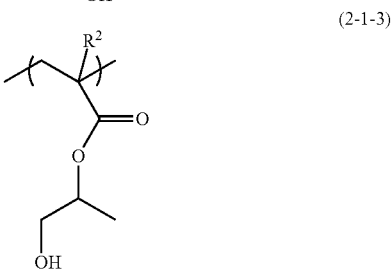

(2-1-3)

(2-1-4)

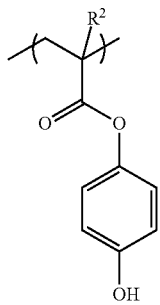

wherein R² is the same as defined for the formula (2).

The structural unit (II-2) is preferably any of structural units shown by the following formulas.

(2-2-1)

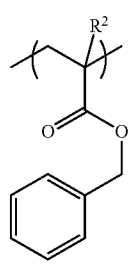

(2-2-2)

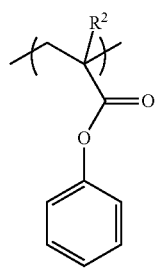

(2-2-3)

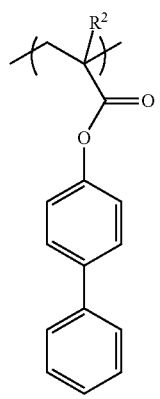

(2-2-4)

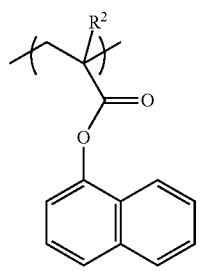

(2-2-5)

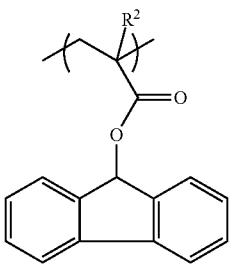

wherein R² is the same as defined for the formula (2).

Examples of a monomer that produces the structural unit (II) include 3-(1-oxa-2-oxo)cyclopentyl(meth)acrylate, benzyl(meth)acrylate, 4-hydroxyphenyl(meth)acrylate, 2-hydroxypropyl(meth)acrylate, 2-hydroxyethyl(meth)acrylate, and the like.

The content of the structural unit (II) in the polymer (A) is preferably 30 to 95 mol %, and more preferably 40 to 90 mol %. If the content of the structural unit (II) is within the above range, the reactivity of the polymer (A) with a crosslinking agent or a crosslinkable group is improved.

The content of the structural unit (II-1) in the polymer (A) is preferably 10 to 80 mol %, and more preferably 20 to 70 mol %. The content of the structural unit (II-2) in the polymer (A) is preferably 0 to 50 mol %, and more preferably 20 to 40 mol %. If the content of the structural units (II-1) and (II-2) is within the above range, the reactivity of the polymer (A) with a crosslinking agent or a crosslinkable group is improved, and a resist lower layer film formed using the resist lower layer film-forming composition exhibits an improved radiation absorption rate. It is preferable that the polymer (A) include both the structural units (II-1) and (II-2) within the above specific content range.

Structural Unit (III)

The structural unit (III) includes a fluorine atom. The structural unit (III) is preferably a structural unit shown by the following formula (4).

(4)

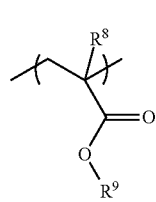

wherein $R^8$ represents a hydrogen atom, a fluorine atom, a methyl group, or a trifluoromethyl group, and $R^9$ represents a linear or branched alkyl group having 1 to 6 carbon atoms that includes a fluorine atom, or a monovalent alicyclic group having 3 to 20 carbon atoms that includes a fluorine atom, provided that some or all of the hydrogen atoms of the alkyl group or the alicyclic group may be substituted with a substituent.

Examples of the linear or branched alkyl group having 1 to 6 carbon atoms that includes a fluorine atom represented by $R^9$ include groups obtained by substituting some or all of the hydrogen atoms of a methyl group, an ethyl group, an n-propyl group, an n-butyl group, or the like with a fluorine atom.

Examples of the monovalent alicyclic group having 3 to 20 carbon atoms that includes a fluorine atom represented by $R^9$ include groups obtained by substituting some or all of the hydrogen atoms of a cyclopentyl group, a cyclopentylpropyl group, a cyclohexyl group, a cyclohexylmethyl group, a cycloheptyl group, a cyclooctyl group, a cyclooctylmethyl group, or the like with a fluorine atom.

Examples of the structural unit (III) include structural units shown by the following formulas (4-1) and (4-2), and the like.

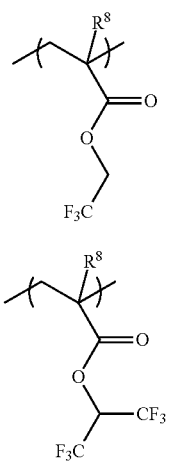

wherein $R^9$ is the same as defined for the formula (4).

Examples of a monomer that produces the structural unit (III) include trifluoromethyl(meth)acrylate, 2,2,2-trifluoroethyl(meth)acrylate, perfluoroethyl(meth)acrylate, perfluoro-n-propyl(meth)acrylate, perfluoro-i-propyl(meth)acrylate, perfluoro-n-butyl(meth)acrylate, perfluoro-i-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2,2,3,3,4,4,5,5-octafluoro)hexyl(meth)acrylate, perfluorocyclohexylmethyl(meth)acrylate, 1-(2,2,3,3,3-pentafluoro)propyl(meth)acrylate, 1-(2,2,3,3,4,4,4-heptafluoro)pentyl(meth)acrylate, 1-(3,3,4,4,5,5,6,6,7,7,8,8,9,9,10,10,10-heptadecafluoro)decyl(meth)acrylate, 1-(5-trifluoromethyl-3,3,4,4,5,6,6,6-octafluoro)hexyl(meth)acrylate, and the like.

The content of the structural unit (III) in the polymer (A) is preferably 1 to 40 mol %, and more preferably 5 to 30 mol %.
Synthesis of Polymer (A)

The polymer (A) may be produced by polymerizing a monomer that produces each structural unit in an appropriate solvent using a radical initiator, for example.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), and the like. These initiators may be used either individually or in combination.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethanes, and diethoxyethanes; alcohols such as methanol, ethanol, 1-propanol, 2-propanol, and 4-methyl-2-pentanol; and the like. These solvents may be used either individually or in combination.

The polymerization temperature is normally 40 to 150° C., and preferably 50 to 150° C. The polymerization time is normally 1 to 48 hours, and preferably 1 to 24 hours.

The polystyrene-reduced weight average molecular weight (Mw) of the polymer (A) determined by gel permeation chromatography (GPC) is preferably 1000 to 100,000, more preferably 2000 to 50,000, and particularly preferably 3000 to 30,000. If the Mw of the polymer (A) is less than 1000, the intermixing resistance of the resulting film may deteriorate. If the Mw of the polymer (A) exceeds 100,000, the in-plane uniformity of the resulting lower layer film may deteriorate.

The ratio Mw/Mn of the Mw to the polystyrene-reduced number average molecular weight (Mn) of the polymer (A) determined by GPC is normally 1 to 3, and preferably 1 to 2.5.
<Crosslinking Agent (B)>

The crosslinking agent (B) that may be used for the resist lower layer film-forming composition according to one embodiment of the invention is a compound that forms a bond with another component (e.g., resin) or another crosslinkable molecule due to heat or an acid. Examples of the crosslinking agent (B) include polyfunctional(meth)acrylate compounds, epoxy compounds, hydroxymethyl group-substituted phenol compounds, alkoxyalkylated amino group-containing compounds, and the like.

Examples of the polyfunctional(meth)acrylate compounds include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerol tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compounds include novolac-type epoxy resins, bisphenol-type epoxy resins, alicyclic epoxy resins, aliphatic epoxy resins, and the like.

Examples of the hydroxymethyl group-substituted phenol compounds include 2-hydroxymethyl-4,6-dimethylphenol, 1,3,5-trihydroxymethylbenzene, 3,5-dihydroxymethyl-4-methoxytoluene[2,6-bis(hydroxymethyl)-p-cresol], and the like.

Examples of the alkoxyalkylated amino group-containing compounds include nitrogen-containing compounds that include a plurality of active methylol groups in one molecule (e.g., (poly)methylol melamine, (poly)methylol glycoluril, (poly)methylol benzoquanamine, and (poly)methylol urea) wherein at least one of the hydrogen atoms of the hydroxyl groups of the methylol groups is substituted with an alkyl group (e.g., methyl group or butyl group), and the like. Note that the alkoxyalkylated amino group-containing compounds may be a mixture of a plurality of substituted compounds, and may include a self-condensed oligomer component. Such alkoxyalkylated amino group-containing compounds may also be used. Among these, alkoxyalkylated amino group-containing compounds are preferable. It is more preferable to use methylol melamine or methylol glycoluril.

The crosslinking agent (B) is more preferably a compound that includes at least two crosslinkable functional groups. The term "crosslinkable functional group" used herein refers to a functional group that exhibits crosslinking reactivity with the polymer (A). Examples of the crosslinkable functional group include a glycidyl ether group, a glycidyl ester group, a glycidyl amino group, a methoxymethyl group, an ethoxymethyl group, a benzyloxymethyl group, an acetoxymethyl group, a benzoyloxymethyl group, a formyl group, an acetyl group, a vinyl group, an isopropenyl group, a dimethylaminomethyl group, a diethylolaminomethyl group, a dimethylolaminomethyl group, a diethylolaminomethyl group, a morpholinomethyl group, and the like. The compound that includes a crosslinkable functional group is preferably methoxymethyl glycoluril or methoxymethylmelamine, and particularly preferably hexamethoxymethylmelamine or tetramethoxymethyl glycoluril.

These crosslinking agents (B) may be used either individually or in combination.

The crosslinking agent (B) may undergo a crosslinking reaction due to self-condensation. When the polymer (A) includes a crosslinkable functional group, the crosslinking agent (B) may undergo a crosslinking reaction with the crosslinkable functional group. When the structural unit (II) shown by the formula (2) included in the polymer (A) includes a hydroxyl group or an amino group, the crosslinkable functional group included in the crosslinking agent may undergo a crosslinking reaction with the hydroxyl group or the amino group.

The crosslinking agent (B) is used in an appropriate amount so that a lower layer film formed using the resist lower layer film-forming composition is sufficiently cured. The crosslinking agent (B) is normally used in an amount of 0.001 to 100 parts by mass, preferably 0.01 to 50 parts by mass, and more preferably 0.1 to 30 parts by mass, based on 100 parts by mass of the polymer (A) included in the resist lower layer film-forming composition. If the amount of the crosslinking agent (B) is less than 0.001 parts by mass, the resulting resist lower layer film may exhibit insufficient hardness. If the amount of the crosslinking agent (B) exceeds 100 parts by mass, a crosslinking reaction may occur between the crosslinking agent included in the resist lower layer film and the resist film.

<Additional Optional Component>

The resist lower layer film-forming composition may include (C) a crosslinking catalyst, (D) a solvent, (E) a surfactant, (F) a preservative, or the like as an additional optional component. Each additional optional component is described in detail below.

Crosslinking Catalyst (C)

Examples of the crosslinking catalyst (C) include amine compounds, phenol resins, amino resins, mercaptan compounds, hydrazides, polyphenol, polybasic acids, photoacid generators, thermal acid generators, and the like. Among these, it is preferable to use a photoacid generator or a thermal acid generator since a decrease in productivity or a deterioration in optical properties due to the remaining catalyst occurs to only a small extent.

The compounds shown by the following formulas are preferable as the crosslinking catalyst (C).

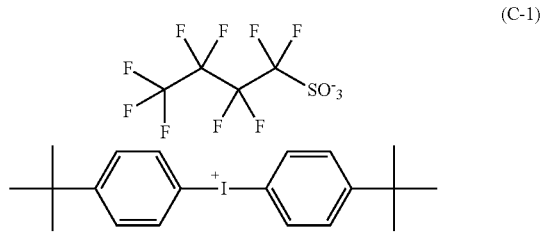

(C-1)

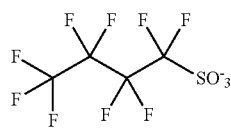

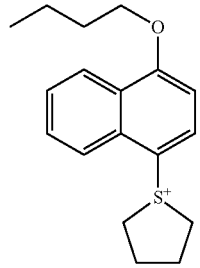

(C-2)

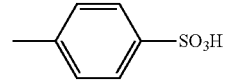

(C-3)

Solvent (D)

The resist lower layer film-forming composition normally includes the solvent (D). The solvent (D) is not particularly limited as long as the solvent (D) can dissolve at least the polymer (A), the crosslinking agent (B), and an additional optional component. Examples of the solvent (D) include alcohol solvents, ether solvents, ketone solvents, amide solvents, ester solvents, hydrocarbon solvents, a mixed solvent thereof, and the like.

Examples of the alcohol solvents include monohydric alcohol solvents such as methanol, ethanol, n-propanol, i-propanol, n-butanol, i-butanol, sec-butanol, tert-butanol, n-pentanol, i-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol methyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether solvents include diethyl ether, dipropyl ether, dibutyl ether, diphenyl ether, and the like.

Examples of the ketone solvents include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, methylcyclohexanone, 2,4-pentanedione, acetonylacetone, acetophenone, and the like.

Examples of the amide solvents include N,N'-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like.

Examples of the ester solvents include diethyl carbonate, propylene carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvents include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, diisopropylbenzene, and n-amylnaphthalene; and the like.

Among these, propylene glycol monomethyl ether, propylene glycol monomethyl ether acetate, and cyclohexanone are preferable. These organic solvents may be used either individually or in combination.

Surfactant (E)

The surfactant may be added to improve the applicability of the resist lower layer film-forming composition, reduce nonuniform application, and improve the developability of the irradiated area. Examples of a preferable surfactant include nonionic surfactants, fluorine-based surfactants, and silicone surfactants.

Examples of the nonionic surfactants include polyoxyethylene alkyl ethers such as polyoxyethylene lauryl ether, polyoxyethylene stearyl ether, and polyoxyethylene oleyl ether; polyoxyethylene aryl ethers such as polyoxyethylene octyl phenyl ether and polyoxyethylene nonyl phenyl ether; polyethylene glycol dialkyl esters such as polyethylene glycol dilaurate and polyethylene glycol distearate; (meth)acrylic acid copolymers; and the like. Examples of the (meth)acrylic acid copolymers include Polyflow No. 57, Polyflow No. 95 (manufactured by Kyoeisha Chemical Co., Ltd.), and the like.

Examples of the fluorine-based surfactants include fluoroethers such as 1,1,2,2-tetrafluorooctyl (1,1,2,2-tetrafluoropropyl)ether, 1,1,2,2-tetrafluorooctyl hexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, and hexapropylene glycol di(1,1,2,2,3,3-hexafluoropentyl)ether; sodium perfluorododecylsulfonate; fluoroalkanes such as 1,1,2,2,8,8,9,9,10,10-decafluorododecane and 1,1,2,2,3,3-hexafluorodecane; sodium fluoroalkylbenzenesulfonates; fluoroalkyloxyethylene ethers; fluoroalkyl ammonium iodides; fluoroalkyl polyoxyethylene ethers; perfluoroalkylpolyoxyethanols; perfluoroalkyl alkoxylates; fluorine-containing alkyl esters; and the like.

Examples of commercially available products of the fluorine-based surfactants include EFTOP EF301, EFTOP EF303, EFTOP EF352 (manufactured by JEMCO, Inc.), Megafac F171, Megafac F172, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), FTX-218 (manufactured by NEOS Co., Ltd.), and the like.

Examples of the silicone surfactants include SH200-100cs, SH28PA, SH30PA, ST89PA, SH190 (manufactured by Dow Corning Toray Silicone Co., Ltd.), KP341 (organosiloxane polymer) (manufactured by Shin-Etsu Chemical Co., Ltd.), and the like.

The surfactant (E) is preferably used in an amount of 0.001 to 10 parts by mass, and more preferably 0.005 to 5 parts by mass, based on 100 parts by mass of the polymer (A). If the surfactant (E) is used in an amount of 0.001 to 10 parts by mass, the applicability of the resist lower layer film-forming composition can be optimized.

<Production of Resist Lower Layer Film-Forming Composition>

The resist lower layer film-forming composition is produced by homogeneously mixing the polymer (A), the crosslinking agent (B) (preferable component), and an additional optional component (e.g., crosslinking catalyst (C), solvent (D), and surfactant (E)). The resist lower layer film-forming composition is normally used in a state in which the components are dissolved or dispersed in an appropriate solvent.

When producing the resist lower layer film-forming composition as a solution, the solid content (i.e., the total concentration of the polymer (A), the crosslinking agent (B) (preferable component), and an additional optional component (e.g., crosslinking catalyst (C)) may be appropriately adjusted depending on the application, the desired thickness, and the like. The solid content is preferably 0.5 to 50 mass %, and more preferably 1 to 40 mass %. The solid content is still more preferably 1.5 to 35 mass %. The solution of the resist lower layer film-forming composition thus obtained may be filtered through a millipore filter (pore size: about 0.2 to 0.5 μm) or the like before use.

<Polymer>

A polymer according to one embodiment of the invention includes the structural unit (I) shown by the formula (1-1), the structural unit (II-1) shown by the formula (2-1), and the structural unit (II-2) shown by the formula (2-2). Specifically, the polymer includes a structural unit that includes a hydroxyl group or an amino group, and a structural unit that includes an aromatic ring. When using the polymer as a material for the resist lower layer film-forming composition according to one embodiment of the invention, the resulting resist lower layer film exhibits excellent hardness and excellent adhesion due to a crosslinking reaction with a crosslinking agent, and also exhibits excellent radiation (e.g., ArF excimer laser light) absorbency. Therefore, the polymer may suitably be used as a material for the resist lower layer film-forming composition according to one embodiment of the invention. The description given above in connection with the polymer (A) included in the resist lower layer film-forming composition may be applied to the polymer according to one embodiment of the invention.

<Resist Lower Layer Film>

A resist lower layer film according to one embodiment of the invention is formed using the resist lower layer film-forming composition that includes the polymer (A) that includes a cyclic carbonate structure. Therefore, the resist lower layer film exhibits a high etching rate, so that the etching selectivity ratio of the resist lower layer film to the resist film and the substrate increases. The resist lower layer film also exhibits excellent adhesion to the resist film. Since the polymer (A) includes the structural unit that includes an aromatic ring, the resist lower layer film exhibits excellent radiation (e.g., ArF excimer laser light) absorbency, and may suitably be used as an anti-reflective film. Since the polymer (A) includes a hydroxyl group or an amino group, a crosslinking reaction with the crosslinking agent (B) is promoted, so that the resist lower layer film exhibits improved intermixing resistance. The resist lower layer film may suitably be used for technical applications that require high resolution.

The thickness of the resist lower layer film is normally 5 to 200 nm The thickness of the resist lower layer film is preferably 10 to 100 nm when it is desired to improve the patterning capability.

<Method of Producing Resist Lower Layer Film>

The resist lower layer film may be produced by applying the resist lower layer film-forming composition to the surface of a substrate, another lower layer film, or the like to form a film, and heating the film, or curing the film by application of ultraviolet rays and heating when the composition includes a latent photoacid generator, for example. Examples of the substrate include a wafer coated with an insulating film (e.g., silicon oxide, silicon nitride, silicon oxynitride, or polysiloxane) or a low-dielectric-constant insulating film (e.g., Black Diamond (manufactured by AMAT), SiLK (manufactured by Dow Chemical), or LKD5109 (manufactured by JSR Corporation)). A patterned substrate provided with a trench, a plug groove (via), or the like may also be used as the substrate.

The resist lower layer film-forming composition may be applied by spin coating, roll coating, dip coating, or the like. The film is normally heated at 50 to 450° C.

<Pattern-Forming Method>

A pattern-forming method according to one embodiment of the invention includes (1) applying the resist lower layer film-forming composition to a substrate to form a resist lower layer film (hereinafter may be referred to as "step (1)"), (2) applying a resist composition to the resist lower layer film to form a resist film (hereinafter may be referred to as "step (2)"), (3) exposing the resist film by selectively applying radiation to the resist film via a photomask (hereinafter may be referred to as "step (3)"), (4) developing the exposed resist film to form a resist pattern (hereinafter may be referred to as "step (4)"), and (5) dry-etching the resist lower layer film and the substrate using the resist pattern as a mask to form a pattern (hereinafter may be referred to as "step (5)").

Each step is described below.

Step (1)

In the step (1), the resist lower layer film is formed on the substrate using the resist lower layer film-forming composition. A substrate on which the resist lower layer film is formed can thus be obtained. Examples of the substrate include those mentioned above in connection with the method of producing a resist lower layer film.

An additional lower layer film differing from the resist lower layer film obtained using the resist lower layer film-forming composition according to one embodiment of the invention may be formed on the substrate in advance. The additional lower layer film is provided with an anti-reflective function, flatness, high etching resistance to a fluorine-containing gas (e.g., $CF_4$), and the like. The additional lower layer film may be formed by a known method using a commercially available material (e.g., "NFC HM8005" (manufactured by JSR Corporation) or "NFC CT08" (manufactured by JSR Corporation)) or the like.

The resist lower layer film may be formed by an arbitrary method. For example, the resist lower layer film may be formed by applying the resist lower layer film-forming composition to the substrate by spin coating or the like to form a film, and curing the film by exposure and/or heating. Examples of radiation used for exposure include visible rays, ultraviolet rays, deep ultraviolet rays, X-rays, electron beams, γ-rays, molecular beams, ion beams, and the like. The heating temperature is not particularly limited, but is preferably 90 to 550° C., more preferably 90 to 450° C., and still more preferably 90 to 300° C. The thickness of the resist lower layer film is not particularly limited, but is normally 5 to 200 nm The thickness of the resist lower layer film is preferably 10 to 100 nm when it is desired to improve the patterning capability.

Step (2)

In the step (2), the resist film is formed on the resist lower layer film obtained by the step (1) using the resist composition. Examples of a preferred resist composition used in the step (2) include a positive-tone or negative-tone chemically-amplified resist composition that includes a photoacid generator, a positive-tone resist composition that includes an alkali-soluble resin and a quinone diazide sensitizer, a negative-tone resist composition that includes an alkali-soluble resin and a crosslinking agent, and the like.

The solid content of the resist composition is not particularly limited, but is preferably 5 to 50 mass %, for example.

The resist composition may preferably be filtered through a filter having a pore size of about 0.2 μm. A commercially available resist composition may directly be used as the resist composition used for the pattern-forming method according to one embodiment of the invention.

The resist composition may be applied by an arbitrary method. For example, the resist composition may be applied by spin coating or the like. The amount of the resist composition applied is adjusted so that the resulting resist film has a given thickness.

The resist film may be formed by prebaking the film formed using the resist composition to volatilize a solvent (i.e., a solvent included in the resist composition) from the film. The prebaking temperature is appropriately adjusted depending on the type of the resist composition. The prebaking temperature is preferably 30 to 200° C., and more preferably 50 to 150° C. Note that another film may be formed on the surface of the resist film.

Step (3)

In the step (3), the resist film obtained by the step (2) is exposed by selectively applying radiation to the resist film via a photomask. Radiation used in the step (3) is appropriately selected from visible rays, ultraviolet rays, deep ultraviolet rays, X-rays, electron beams, γ-rays, molecular beams, ion beams, and the like depending on the type of acid generator included in the resist composition. Among these, it is preferable to use deep ultraviolet rays. It is particularly preferable to use KrF excimer laser light (248 nm), ArF excimer laser light (193 nm), $F_2$ excimer laser light (157 nm), $Kr_2$ excimer laser light (147 nm), or ArKr excimer laser light (134 nm), extreme ultraviolet rays (e.g., 13.5 nm), or the like.

The exposure method is not particularly limited. A known method used when forming a pattern may be employed. Liquid immersion lithography may also be employed.

Step (4)

In the step (4), the resist film exposed in the step (3) is developed to form a resist pattern. A developer used for development may be appropriately selected depending on the type of the resist composition. When using a positive-tone chemically-amplified resist composition or a positive-tone resist composition that includes an alkali-soluble resin, an alkaline aqueous solution of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like may be used as the developer. An appropriate amount of an aqueous organic solvent, an alcohol (e.g., methanol or ethanol), or a surfactant may be added to the alkaline aqueous solution.

When using a negative-tone chemically-amplified resist composition or a negative-tone resist composition that includes an alkali-soluble resin, an aqueous solution of an alkali (e.g., inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine) may be used as the developer.

In the step (4), the resist film developed using the developer may be washed and dried to form a given resist pattern corresponding to the photomask.

In the step (4), it is preferable to postbake the resist film before development (i.e. after exposure in the step (3)) in order to improve the resolution, the pattern profile, the developability, and the like. The postbaking temperature is appropriately selected depending on the type of the resist composition and the like. The postbaking temperature is preferably 50 to 200° C., and more preferably 80 to 150° C.

Step (5)

In the step (5), the resist lower layer film and the substrate are dry-etched using the resist pattern formed by the step (4) as a mask (etching mask) to form a pattern. When using a substrate on which another lower layer film is formed, the lower layer film is dry-etched together with the resist lower layer film and the substrate. The resist lower layer film and the substrate may be dry-etched using a dry-etching system. As a source gas used for dry-etching, an oxygen-containing gas (e.g., $O_2$, CO, or $CO_2$), an inert gas (e.g., He, $N_2$, or Ar), a chlorine-containing gas (e.g., $Cl_2$ or $BCl_4$), $H_2$, $NH_3$, or the like may be used depending on the elemental composition of the etching target. A mixture of these gases may also be used.

The resist lower layer film formed using the resist lower layer film-forming composition exhibits a high etching rate and excellent adhesion to the resist film. Therefore, the resist lower layer film exhibits high pattern collapse resistance. Accordingly, a finer pattern can be formed by the pattern-forming method according to one embodiment of the invention.

<Method of Producing Semiconductor Device>

A method of producing a semiconductor device according to one embodiment of the invention includes (1) applying the resist lower layer film-forming composition to a substrate to form a resist lower layer film (hereinafter may be referred to as "step (1)"), (2) applying a resist composition to the resist lower layer film to form a resist film (hereinafter may be referred to as "step (2)"), (3) exposing the resist film by selectively applying radiation to the resist film via a photomask (hereinafter may be referred to as "step (3)"), (4) developing the exposed resist film to form a resist pattern (hereinafter may be referred to as "step (4)"), (5) dry-etching the resist lower layer film and the substrate using the resist pattern as a mask to form a pattern (hereinafter may be referred to as "step (5)"), and (6) forming an integrated circuit element (hereinafter may be referred to as "step (6)").

Each step is described below. The steps (1) to (5) are the same as the steps (1) to (5) of the pattern-forming method.

Step (6)

In the step (6), an integrated circuit is formed by a known method using the substrate on which the pattern is formed.

EXAMPLES

The invention is further described below by way of examples. Note that the invention is not limited to the following examples. The property values were measured by the following methods.

Weight Average Molecular Weight (Mw) and Number Average Molecular Weight (Mn)

The weight average molecular weight (Mw) and the number average molecular weight (Mn) were measured by gel permeation chromatography (GPC) using GPC columns (manufactured by Tosoh Corporation, G2000HXL×2, G3000HXL×1, G4000HXL×1) at a flow rate of 1.0 ml/min and a column temperature of 40° C. (eluant: tetrahydrofuran, standard: monodisperse polystyrene).

$^{13}$C-NMR Analysis

The polymer was subjected to $^{13}$C-NMR analysis (for determining the fluorine atom content (mass %)) using a nuclear magnetic resonance spectrometer ("JNM-ECX400" manufactured by JEOL Ltd.).

<Synthesis of Polymer (A)>

Polymers (A-1) to (A-6) and (a-1) to (a-6) were synthesized using compounds (M-1) to (M-12) shown by the following formulas. Note that the compounds used to synthesize polymers (R-1) and (R-2) for producing a resist composition are also shown below.

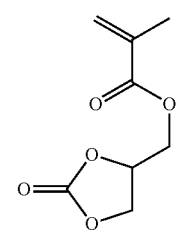

(M-1)

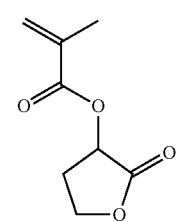

(M-2)

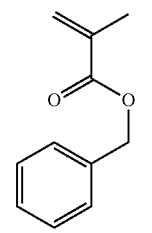

(M-3)

-continued

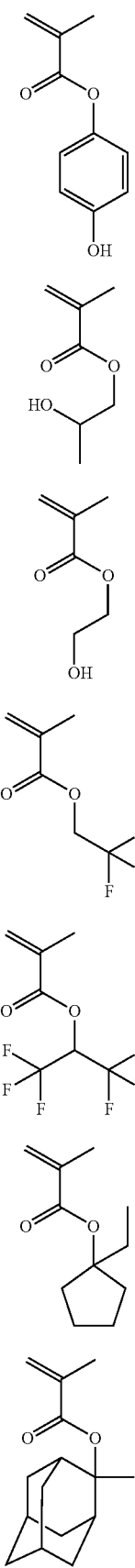

(M-4)

(M-5)

(M-6)

(M-7)

(M-8)

(M-9)

(M-10)

-continued

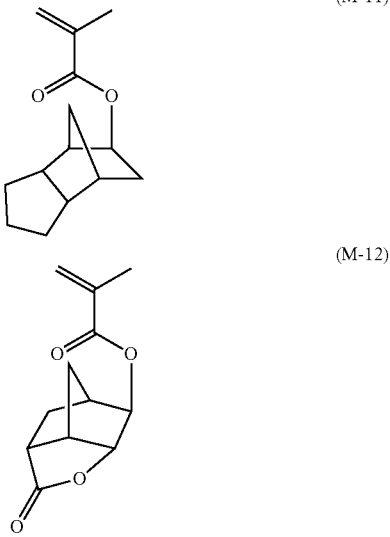

(M-11)

(M-12)

Example 1

A flask (200 ml) was charged with 7.00 g (31 mol %) of the compound (M-1), 6.63 g (31 mol %) of the compound (M-3), 6.37 g (38 mol %) of the compound (M-5), 0.55 g of dimethyl 2,2'-azobis(2-methylpropionate), and 40 g of propylene glycol monomethyl ether. The mixture was stirred at 80° C. for 5 hours under a nitrogen atmosphere to polymerize the monomers. After completion of polymerization, the polymer solution was cooled with water to 30° C. or less, and poured into 300 g of a methanol:water (mass ratio: 9:1) mixture to precipitate the polymer. After removing the supernatant liquid, 60 g of methanol was added to the precipitated polymer to wash the polymer. After removing the supernatant liquid, the polymer was dried at 50° C. for 17 hours to obtain a polymer (A-1) (12.8 g, yield: 64%). The polymer (A-1) (copolymer) had an Mw of 21,600 and a ratio Mw/Mn of 2.2. As a result of $^{13}$C-NMR analysis, it was found that the content of the compound (M-1), the content of the compound (M-3), and the content of the compound (M-5) in the polymer (A-1) were 32 mol %, 31 mol %, and 37 mol %, respectively.

Example 2

A flask (200 ml) was charged with 7.00 g (31 mol %) of the compound (M-1), 6.63 g (31 mol %) of the compound (M-3), 6.37 g (38 mol %) of the compound (M-5), 0.55 g of dimethyl 2,2'-azobis(2-methylpropionate), and 40 g of propylene glycol monomethyl ether. The mixture was stirred at 80° C. for 5 hours under a nitrogen atmosphere. After the addition of 0.23 g (1 mol %) of dimethyl 2,2'-azobis(2-methylpropionate), the mixture was heated to 90° C., and reacted for 1 hour. A solution containing a polymer (A-2) was thus obtained. The polymer (A-2) (copolymer) had an Mw of 23,400 and a ratio Mw/Mn of 2.3. The concentration of the solution was 33.3%.

Examples 3 to 6 and Comparative Examples 1 to 6

Polymers (A-3) to (A-6) and (a-1) to (a-6) were synthesized in the same manner as in Example 2, except for changing the type and the amount of each component as shown in Table 1. The Mw and the ratio Mw/Mn of each polymer are also shown in Table 1.

TABLE 1

|  | Polymer | Structural unit (I) | | Structural unit (II)-1 | | Structural unit (II)-2 | | Structural unit (III) | | Mw | Mw/Mn |
|---|---|---|---|---|---|---|---|---|---|---|---|
|  |  | Monomer | Amount (mol %) | Monomer | Amount (mol %) | Monomer | Amount (mol %) | Monomer | Amount (mol %) |  |  |
| Example 1 | A-1 | M-1 | 31 | M-5 | 38 | M-3 | 31 | — | — | 21,600 | 2.1 |
| Example 2 | A-2 | M-1 | 31 | M-5 | 38 | M-3 | 31 | — | — | 23,400 | 2.2 |
| Example 3 | A-3 | M-1 | 31 | M-6 | 38 | M-3 | 31 | — | — | 24,100 | 2.2 |
| Example 4 | A-4 | M-1 | 31 | M-4/M-5 | 31/38 | — | — | — | — | 22,800 | 2.3 |
| Example 5 | A-5 | M-1 | 21 | M-5 | 38 | M-3 | 31 | M-7 | 10 | 23,100 | 2.1 |
| Example 6 | A-6 | M-1 | 21 | M-5 | 38 | M-3 | 31 | M-8 | 10 | 23,700 | 2.2 |
| Comparative Example 1 | a-1 | M-2 | 31 | M-5 | 38 | M-3 | 31 | — | — | 21,900 | 2.1 |
| Comparative Example 2 | a-2 | M-2 | 31 | M-5 | 38 | M-3 | 31 | — | — | 23,700 | 2.1 |
| Comparative Example 3 | a-3 | M-2 | 31 | M-6 | 38 | M-3 | 31 | — | — | 24,200 | 2.2 |
| Comparative Example 4 | a-4 | M-2 | 31 | M-5 | 38 | M-4 | 31 | — | — | 23,000 | 2.3 |
| Comparative Example 5 | a-5 | M-2 | 21 | M-5 | 38 | M-3 | 31 | M-7 | 10 | 23,500 | 2 |
| Comparative Example 6 | a-6 | M-2 | 21 | M-5 | 38 | M-3 | 31 | M-8 | 10 | 23,800 | 2.2 |

Production of Polymer for Forming Resist Film

Synthesis Example 1

18.60 g (15 mol %) of the compound (M-9), 6.20 g (35 mol %) of the compound (M-10), and 25.20 g (50 mol %) of the compound (M-12) were dissolved in 100 g of 2-butanone, and 1.86 g of dimethyl 2,2'-azobis(2-methylpropionate) was dissolved in the solution to prepare a monomer solution. A three-necked flask (500 ml) charged with 50 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the polymer solution was cooled with water to 30° C. or less, and poured into 1000 g of methanol. A white powder that precipitated by this operation was collected by filtration. The white powder thus collected was washed with 200 g of methanol in a slurry state, and collected by filtration. This operation was repeated once. The white powder was dried at 50° C. for 17 hours to obtain a white powdery copolymer (39 g, yield: 78%). The copolymer had an Mw of 6300 and a ratio Mw/Mn of 1.4. The copolymer is referred to as "polymer (R-1)".

Synthesis Example 2

17.69 g (40 mol %) of the compound (M-9), 5.35 g (10 mol %) of the compound (M-11), and 26.96 g (50 mol %) of the compound (M-12) were dissolved in 100 g of 2-butanone, and 1.99 g of dimethyl 2,2'-azobis(2-methylpropionate) was dissolved in the solution to prepare a monomer solution. A three-necked flask (500 ml) charged with 50 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the polymer solution was cooled with water to 30° C. or less, and poured into 1000 g of methanol. A white powder that precipitated by this operation was collected by filtration. The white powder thus collected was washed with 200 g of methanol in a slurry state, and collected by filtration. This operation was repeated once. The white powder was dried at 50° C. for 17 hours to obtain a white powdery copolymer (41 g, yield: 82%). The copolymer had an Mw of 6100 and a ratio Mw/Mn of 1.4. The copolymer is referred to as "polymer (R-2)".

<Production of Resist Lower Layer Film-Forming Composition>

Each component (crosslinking agent (B), crosslinking catalyst (C), solvent (D), and additional optional component) other than the polymers (A-1) to (A-6) and (a-1) to (a-6) used to form a resist lower layer film-forming composition is shown below.

Crosslinking Agent (B)

Compounds Shown by the Following Formulas (B-1) and (B-2)

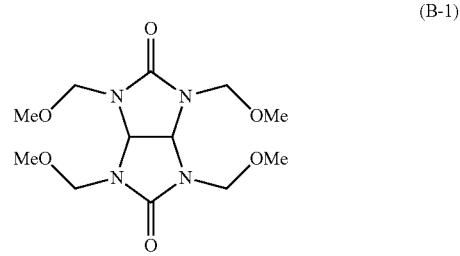

(B-1)

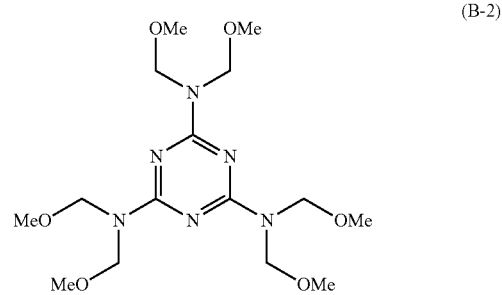

(B-2)

Crosslinking Catalyst (C)
Compound Shown by the Following Formula (C-1)

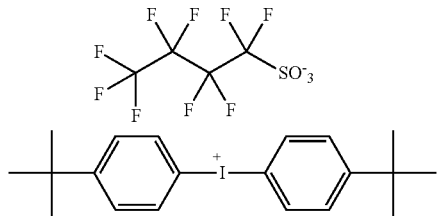

(C-1)

Solvent (D)
(D-1): propylene glycol monomethyl ether
(D-2): propylene glycol monomethyl ether acetate
(D-3): cyclohexanone
Surfactant (E)
FTX-218 (manufactured by NEOS Co., Ltd.)

Production of Resist Lower Layer Film-Forming Composition

Example 7

100 parts by mass of the polymer (A-1), 20 parts by mass of the crosslinking agent (B-1), 3 parts by mass of the crosslinking catalyst (C-1), 1800 parts by mass of the solvent (D-1), and 1800 parts by mass of the solvent (D-2) were mixed to obtain a resist lower layer film-forming composition (T-1).

Examples 8 to 19 and Comparative Examples 7 to 19

Resist lower layer film-forming compositions (T-2) to (T-26) were obtained in the same manner as in Example 7, except for changing the type and the amount of each component as shown in Table 2. In Example 19 and Comparative Example 19, the surfactant (E) was added in an amount shown in Table 2.

TABLE 2

|  | Resist lower layer film-forming composition | Component (A) Type | Parts by mass | Crosslinking agent (B) Type | Parts by mass | Crosslinking catalyst (C) Type | Parts by mass | Solvent (D) Type | Parts by mass | Additive (E) Type | Parts by mass |
|---|---|---|---|---|---|---|---|---|---|---|---|
| Example 7 | T-1 | A-1 | 100 | B-1 | 20 | C-1 | 5 | D-1<br>D-2 | 1,800<br>1,800 | — | — |
| Example 8 | T-2 | A-2 | 100 | B-1 | 20 | C-1 | 5 | D-1<br>D-2 | 1,800<br>1,800 | — | — |
| Example 9 | T-3 | A-3 | 100 | B-1 | 20 | C-1 | 5 | D-1<br>D-2 | 1,800<br>1,800 | — | — |
| Example 10 | T-4 | A-4 | 100 | B-1 | 20 | C-1 | 5 | D-1<br>D-2 | 1,800<br>1,800 | — | — |
| Example 11 | T-5 | A-5 | 100 | B-1 | 25 | C-1 | 5 | D-1<br>D-2 | 1,800<br>1,800 | — | — |
| Example 12 | T-6 | A-6 | 100 | B-1 | 25 | C-1 | 5 | D-1<br>D-2 | 1,800<br>1,800 | — | — |
| Example 13 | T-7 | A-1 | 100 | B-2 | 15 | C-1 | 5 | D-1<br>D-2 | 1,800<br>1,800 | — | — |
| Example 14 | T-8 | A-1 | 100 | B-1<br>B-2 | 10<br>7 | C-1 | 5 | D-1<br>D-2 | 1,800<br>1,800 | — | — |
| Example 15 | T-9 | A-1 | 100 | B-1 | 20 | C-2 | 5 | D-1<br>D-2 | 1,800<br>1,800 | — | — |
| Example 16 | T-10 | A-1 | 100 | B-1 | 20 | C-1<br>C-2 | 3<br>2 | D-1<br>D-2 | 1,800<br>1,800 | — | — |
| Example 17 | T-11 | A-1 | 100 | B-1 | 20 | C-3 | 5 | D-1<br>D-2 | 1,800<br>1,800 | — | — |
| Example 18 | T-12 | A-1 | 100 | B-1 | 20 | C-1 | 5 | D-2<br>D-3 | 1,800<br>1,800 | — | — |
| Example 19 | T-13 | A-1 | 100 | B-1 | 20 | C-1 | 5 | D-1<br>D-2 | 1,800<br>1,800 | E-1 | 0.02 |
| Comparative Example 7 | T-14 | a-1 | 100 | B-1 | 20 | C-1 | 5 | D-1<br>D-2 | 1,800<br>1,800 | — | — |
| Comparative Example 8 | T-15 | a-2 | 100 | B-1 | 20 | C-1 | 5 | D-1<br>D-2 | 1,800<br>1,800 | — | — |
| Comparative Example 9 | T-16 | a-3 | 100 | B-1 | 20 | C-1 | 5 | D-1<br>D-2 | 1,800<br>1,800 | — | — |
| Comparative Example 10 | T-17 | a-4 | 100 | B-1 | 20 | C-1 | 5 | D-1<br>D-2 | 1,800<br>1,800 | — | — |
| Comparative Example 11 | T-18 | a-5 | 100 | B-1 | 25 | C-1 | 5 | D-1<br>D-2 | 1,800<br>1,800 | — | — |
| Comparative Example 12 | T-19 | a-6 | 100 | B-1 | 25 | C-1 | 5 | D-1<br>D-2 | 1,800<br>1,800 | — | — |
| Comparative Example 13 | T-20 | a-1 | 100 | B-2 | 15 | C-1 | 5 | D-1<br>D-2 | 1,800<br>1,800 | — | — |
| Comparative Example 14 | T-21 | a-1 | 100 | B-1<br>B-2 | 10<br>7 | C-1 | 5 | D-1<br>D-2 | 1,800<br>1,800 | — | — |
| Comparative Example 15 | T-22 | a-1 | 100 | B-1 | 20 | C-2 | 5 | D-1<br>D-2 | 1,800<br>1,800 | — | — |
| Comparative Example 16 | T-23 | a-1 | 100 | B-1 | 20 | C-1<br>C-2 | 3<br>2 | D-1<br>D-2 | 1,800<br>1,800 | — | — |
| Comparative Example 17 | T-24 | a-1 | 100 | B-1 | 20 | C-3 | 5 | D-1<br>D-2 | 1,800<br>1,800 | — | — |

TABLE 2-continued

|  | Resist lower layer film-forming composition | Component (A) Type | Component (A) Parts by mass | Crosslinking agent (B) Type | Crosslinking agent (B) Parts by mass | Crosslinking catalyst (C) Type | Crosslinking catalyst (C) Parts by mass | Solvent (D) Type | Solvent (D) Parts by mass | Additive (E) Type | Additive (E) Parts by mass |
|---|---|---|---|---|---|---|---|---|---|---|---|
| Comparative Example 18 | T-25 | a-1 | 100 | B-1 | 20 | C-1 | 5 | D-2 D-3 | 1,800 1,800 | — | — |
| Comparative Example 19 | T-26 | a-1 | 100 | B-1 | 20 | C-1 | 5 | D-1 D-2 | 1,800 1,800 | E-1 | 0.02 |

Formation of Resist Lower Layer Film

Examples 20 to 32 and Comparative Examples 20 to 32

The resist lower layer film-forming composition obtained in each example or comparative example was spin-coated onto the surface of an 8-inch silicon wafer, and baked at 205° C. for 60 seconds on a hot plate to form a resist lower layer film having a thickness of 90 nm. The thickness of the resist lower layer film was calculated using a lithography simulator ("Prolith" manufactured by KLA-Tencor) (second minimum value of reflectivity). The refractive index and the extinction coefficient of the resist lower layer film were measured by the following evaluation methods. The results are shown in Table 3.

TABLE 3

|  | Resist lower layer film-forming composition | Refractive index n | Extinction coefficient k |
|---|---|---|---|
| Example 20 | T-1 | 1.80 | 0.35 |
| Comparative Example 20 | T-14 | 1.81 | 0.35 |
| Example 21 | T-2 | 1.80 | 0.35 |
| Comparative Example 21 | T-15 | 1.81 | 0.35 |
| Example 22 | T-3 | 1.79 | 0.35 |
| Comparative Example 22 | T-16 | 1.79 | 0.35 |
| Example 23 | T-4 | 1.73 | 0.34 |
| Comparative Example 23 | T-17 | 1.74 | 0.34 |
| Example 24 | T-5 | 1.79 | 0.35 |
| Comparative Example 24 | T-18 | 1.80 | 0.35 |
| Example 25 | T-6 | 1.79 | 0.35 |
| Comparative Example 25 | T-19 | 1.79 | 0.35 |
| Example 26 | T-7 | 1.80 | 0.36 |
| Comparative Example 26 | T-20 | 1.81 | 0.36 |
| Example 27 | T-8 | 1.80 | 0.35 |
| Comparative Example 27 | T-21 | 1.81 | 0.35 |
| Example 28 | T-9 | 1.80 | 0.34 |
| Comparative Example 28 | T-22 | 1.81 | 0.34 |
| Example 29 | T-10 | 1.81 | 0.34 |
| Comparative Example 29 | T-23 | 1.81 | 0.34 |
| Example 30 | T-11 | 1.80 | 0.35 |
| Comparative Example 30 | T-24 | 1.81 | 0.35 |
| Example 31 | T-12 | 1.80 | 0.35 |
| Comparative Example 31 | T-25 | 1.81 | 0.35 |
| Example 32 | T-13 | 1.80 | 0.35 |
| Comparative Example 32 | T-26 | 1.81 | 0.35 |

As shown in Table 3, the resist lower layer films of the examples had a refractive index and an extinction coefficient almost equal to those of the comparative examples when using a laser having a wavelength of 193 nm. It was thus confirmed that the resist lower layer films of the examples meet the general requirements for an anti-reflective film.

<Formation of Resist Pattern>

Production of Radiation-Sensitive Resin Composition 70 parts by mass of the polymer (R-1), 30 parts by mass of the polymer (R-2), 4 parts by mass of triphenylsulfonium nonafluoro-n-butanesulfonate (acid generator), 5 parts by mass of 4-butoxy-1-naphthyltetrahydrothiophenium nonafluoro-n-butanesulfonate (acid generator), 0.9 parts by mass of N-t-amyloxycarbonyl-4-hydroxypiperidine (acid diffusion controller), 1250 parts by mass of propylene glycol monomethyl ether acetate (solvent), and 520 parts by mass of cyclohexanone (solvent) were mixed to obtain a radiation-sensitive resin composition (P-1).

Formation of Resist Lower Layer Film

The resist lower layer film-forming composition obtained in each example or comparative example was spin-coated onto the surface of an 8-inch silicon wafer, and baked at 205° C. for 60 seconds on a hot plate to form a resist lower layer film having a thickness of 90 nm.

Formation of Resist Film

The radiation-sensitive resin composition (P-1) was spin-coated onto the resist lower layer film, and baked at 120° C. for 60 seconds on a hot plate to form a photoresist film having a thickness of 120 nm Intermixing of the resist with the resist lower layer film (anti-reflective film) was not observed.

Formation of Resist Pattern

The silicon wafer to which the resist lower layer film-forming composition and the radiation-sensitive composition were applied was exposed via a mask pattern using an ArF excimer laser exposure system ("NSR S306C" manufactured by Nikon Corporation). After performing PEB at 115° C. for 60 seconds, the resist film was developed at 25° C. for 30 seconds using a 2.38% tetramethylammonium hydroxide aqueous solution (hereinafter may be referred to as "TMAH aqueous solution"), rinsed with water, and dried to form a positive-tone resist pattern. The pattern collapse dimension was measured by the following evaluation method. The resist lower layer film-forming composition used and the pattern collapse dimension measurement results are shown in Table 4 (Examples 33 to 45 and Comparative Examples 33 to 45).

<Evaluation Method>

Refractive Index and Extinction Coefficient

The refractive index and the extinction coefficient at a wavelength of 193 nm were measured using a spectroscopic ellipsometer.

Collapse Test

The resist film was exposed according to the above procedure using a mask in which nine 1:1 line-and-space patterns (pattern design dimension: 80 nm) were arranged. The dose was increased by 0.5 mJ/cm$^2$, and the average line width of five patterns when four patterns had collapsed was taken as the collapse dimension. A shorter collapse dimension is obtained when pattern collapse is suppressed. The dimensions of the resist pattern were measured using a scanning electron microscope ("S9380" manufactured by Hitachi High-Technologies Corporation).

Etching Rate

The resist lower layer film-forming composition solution was applied to a silicon wafer using a spinner. The composition was baked at 205° C. for 1 minute on a hot plate to form a resist lower layer film. The dry etching rate was measured using $CF_4$ as a dry etching gas. The dry etching rate selectivity ratio of the dry etching rate of the resist lower layer film-forming composition to the dry etching rate (=1) of the radiation-sensitive composition is shown in Table 5 (Example 46 and Comparative Example 46).

TABLE 4

| | Resist lower layer film-forming composition | Collapse dimension (nm) |
|---|---|---|
| Example 33 | T-1 | 56.4 |
| Comparative Example 33 | T-14 | 59.6 |
| Example 34 | T-2 | 56.2 |
| Comparative Example 34 | T-15 | 60.2 |
| Example 35 | T-3 | 60.1 |
| Comparative Example 35 | T-16 | 64.5 |
| Example 36 | T-4 | 58.5 |
| Comparative Example 36 | T-17 | 66.1 |
| Example 37 | T-5 | 61.3 |
| Comparative Example 37 | T-18 | 65.3 |
| Example 38 | T-6 | 60.4 |
| Comparative Example 38 | T-19 | 63.7 |
| Example 39 | T-7 | 54.4 |
| Comparative Example 39 | T-20 | 59.0 |
| Example 40 | T-8 | 55.0 |
| Comparative Example 40 | T-21 | 59.5 |
| Example 41 | T-9 | 53.8 |
| Comparative Example 41 | T-22 | 57.7 |
| Example 42 | T-10 | 56.9 |
| Comparative Example 42 | T-23 | 60.2 |
| Example 43 | T-11 | 59.0 |
| Comparative Example 43 | T-24 | 66.8 |
| Example 44 | T-12 | 59.2 |
| Comparative Example 44 | T-25 | 67.1 |
| Example 45 | T-13 | 56.3 |
| Comparative Example 45 | T-26 | 59.2 |

In the example and the comparative example indicated by the same number in Table 4, a pattern was formed using a resist lower layer film formed using a resist lower layer film-forming composition that was obtained in an identical manner, except that the polymer (A) was used in the example, and a comparative polymer having a lactone skeleton was used in the comparative example. The collapse dimension of the resist lower layer film in the example was shorter than that of the comparative example in each combination. It was thus confirmed that pattern collapse could be suppressed as compared with the comparative example when forming a pattern using the resist lower layer film formed using the resist lower layer film-forming composition of each example.

TABLE 5

| | Resist lower layer film-forming composition | Dry etching rate selectivity ratio |
|---|---|---|
| Example 46 | T-1 | 1.25 |
| Comparative Example 46 | T-14 | 1.11 |

As shown in Table 5, the resist lower layer film formed using the resist lower layer film-forming composition of each example had a high etching rate as compared with the comparative example. It was thus confirmed that the resist lower layer film formed using the resist lower layer film-forming composition including a carbonate structure had a high etching rate as compared with that of the comparative example.

A resist lower layer film that exhibits a high etching rate and implements a high etching selectivity ratio with respect to a resist film can be formed by utilizing the resist lower layer film-forming composition according to the invention. Since the resist lower layer film exhibits excellent adhesion to a resist film, and can suppress pattern collapse, it is possible to form a finer pattern. The resist lower layer film-forming composition can sufficiently deal with various electronic device (e.g., semiconductor device or liquid crystal device) structures for which further miniaturization is desired.

Obviously, numerous modifications and variations of the present invention are possible in light of the above teachings. It is therefore to be understood that within the scope of the appended claims, the invention may be practiced otherwise than as specifically described herein.

What is claimed is:

1. A resist lower layer film-forming composition comprising:
   (A) a polymer including:
      a structural unit (I) shown by a formula (1); and
      a structural unit (II) shown by a formula (2); and
   (B) a crosslinking agent including at least two crosslinkable functional groups,

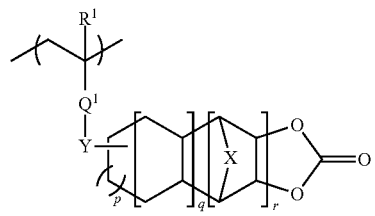

(1)

wherein $R^1$ represents a hydrogen atom, a halogen atom, a methyl group, or a trifluoromethyl group, $Q^1$ represents a divalent linking group, Y represents a single bond, a methylene group, a linear or branched alkylene group having 2 to 10 carbon atoms, an arylene group having 6 to 20 carbon atoms, a 6 to 20-membered heteroarylene group, or a combination thereof, provided that some or all of the hydrogen atoms of the alkylene group, the arylene group, or the heteroarylene group may be substituted with a substituent, and the alkylene group may include an oxygen atom in its carbon chain, p is an integer from 0 to 3, q is 0 or 1, r is an integer from 0 to 2, and X represents —$CH_2$—, —CH, —$CH_2$—, —O—, —S—, or —$SO_2$—, provided that a plurality of X may be either the same or different when r is 2,

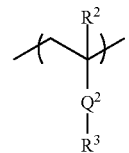

(2)

wherein $R^2$ represents a hydrogen atom, a halogen atom, a methyl group, or a trifluoromethyl group, $Q^2$ represents a divalent linking group, $R^3$ represents an aryl group having 6 to 20 carbon atoms, an aralkyl group having 7 to 20 carbon atoms, or a 6 to 20-membered heteroaryl group, provided that some or all of the hydrogen atoms of the aryl group, the aralkyl group, or the heteroaryl group may be substituted with a substituent.

2. The resist lower layer film-forming composition according to claim 1, wherein the polymer (A) includes a structural unit shown by a formula (1-1) as the structural unit (I), and further includes a structural unit (II-1) shown by a formula (2-1),

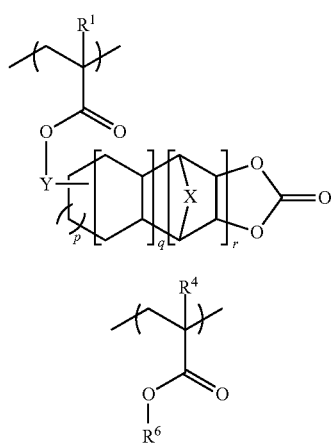

(1-1)

(2-1)

wherein $R^1$, X, Y, p, q, and r are the same as defined for the formula (1), $R^4$ represents a hydrogen atom, a halogen atom, a methyl group, or a trifluoromethyl group, and $R^6$ represents an alkyl group having 1 to 15 carbon atoms or an aryl group having 6 to 20 carbon atoms, provided that some or all of the hydrogen atoms of the alkyl group or the aryl group are substituted with a substituent, at least one substituent being a group that includes a hydroxyl group or an amino group.

3. The resist lower layer film-forming composition according to claim 2, wherein $R^6$ represents the aryl group.

4. The resist lower layer film-forming composition according to claim 1, wherein the polymer (A) further includes a structural unit (III) that includes a fluorine atom.

5. The resist lower layer film-forming composition according to claim 1, wherein the structural unit (II) is a structural unit (II-2) shown by a formula (2-2),

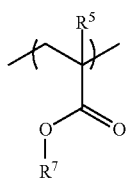

(2-2)

wherein $R^5$ represents a hydrogen atom, a halogen atom, a methyl group, or a trifluoromethyl group, and $R^7$ represents a phenyl group, a naphthyl group, an anthryl group, or a linear or branched alkyl group having 1 to 15 carbon atoms, provided that some or all of the hydrogen atoms of the phenyl group, the naphthyl group, or the anthryl group may be substituted with a substituent other than a hydroxyl group and an amino group, and some or all of the hydrogen atoms of the alkyl group are substituted with a substituent, at least one substituent being a phenyl group, a naphthyl group, or an anthryl group, provided that some or all of the hydrogen atoms of the phenyl group, the naphthyl group, or the anthryl group may be substituted with a substituent other than a hydroxyl group and an amino group.

6. The resist lower layer film-forming composition according to claim 1, wherein the structural unit (II) is a structural unit shown by a formula (2-2-1), a formula (2-2-2), a formula (2-2-3), a formula (2-2-4), a formula (2-2-5), or a combination thereof,

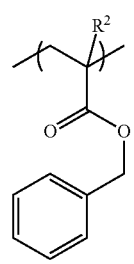

(2-2-1)

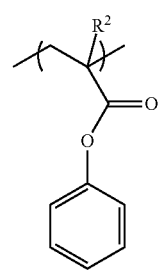

(2-2-2)

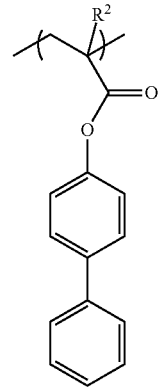

(2-2-3)

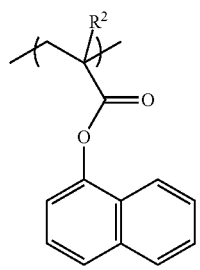

(2-2-4)

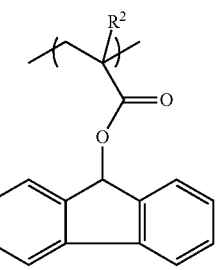

(2-2-5)

wherein $R^2$ is the same as defined for the formula (2).

7. A polymer comprising a structural unit (I) shown by a formula (1-1), a structural unit (II-1) shown by a formula (2-1), and a structural unit (II-2) shown by a formula (2-2),

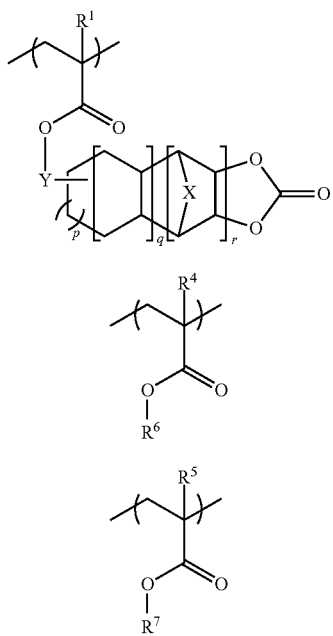

(1-1)

(2-1)

(2-2)

wherein $R^1$, X, Y, p, q, and r are the same as defined for the formula (1), $R^4$ represents a hydrogen atom, a halogen atom, a methyl group, or a trifluoromethyl group, $R^6$ represents an alkyl group having 1 to 15 carbon atoms or an aryl group having 6 to 20 carbon atoms, provided that some or all of the hydrogen atoms of the alkyl group or the aryl group are substituted with a substituent, at least one substituent being a group that includes a hydroxyl group or an amino group, $R^5$ represents a hydrogen atom, a halogen atom, a methyl group, or a trifluoromethyl group, and $R^7$ represents a phenyl group, a naphthyl group, an anthryl group, or a linear or branched alkyl group having 1 to 15 carbon atoms, provided that some or all of the hydrogen atoms of the phenyl group, the naphthyl group, or the anthryl group may be substituted with a substituent other than a hydroxyl group and an amino group, and some or all of the hydrogen atoms of the alkyl group are substituted with a substituent, at least one substituent being a phenyl group, a naphthyl group, or an anthryl group, provided that some or all of the hydrogen atoms of the phenyl group, the naphthyl group, or the anthryl group may be substituted with a substituent other than a hydroxyl group and an amino group.

8. A resist lower layer film formed using the resist lower layer film-forming composition according to claim 1.

9. A pattern-forming method comprising:
 (1) applying the resist lower layer film-forming composition according to claim 1 to a substrate to form a resist lower layer film;
 (2) applying a resist composition to the resist lower layer film to form a resist film;
 (3) exposing the resist film by selectively applying radiation to the resist film via a photomask;
 (4) developing the exposed resist film to form a resist pattern; and
 (5) dry-etching the resist lower layer film and the substrate using the resist pattern as a mask to form a pattern.

10. The pattern-forming method according to claim 9, wherein the resist film is exposed by applying light having a wavelength of 193 nm to the resist film.

11. A method of producing a semiconductor device comprising:
 (1) applying the resist lower layer film-forming composition according to claim 1 to a substrate to form a resist lower layer film;
 (2) applying a resist composition to the resist lower layer film to form a resist film;
 (3) exposing the resist film by selectively applying radiation to the resist film via a photomask;
 (4) developing the exposed resist film to form a resist pattern;
 (5) dry-etching the resist lower layer film and the substrate using the resist pattern as a mask to form a pattern; and
 (6) forming an integrated circuit element that includes the pattern.

12. The method of producing a semiconductor device according to claim 11, wherein the resist film is exposed by applying light having a wavelength of 193 nm to the resist film.

* * * * *